(12) United States Patent
Perez (10) Patent No.: US 7,581,202 B2
(45) Date of Patent: Aug. 25, 2009

(54) METHOD FOR GENERATION, PLACEMENT, AND ROUTING OF TEST STRUCTURES IN TEST CHIPS

(75) Inventor: Julia Perez, Tempe, AZ (US)

(73) Assignee: Freescale Semiconductor Inc., Austin, TX (US)

( * ) Notice: Subject to any disclaimer, the term of this patent is extended or adjusted under 35 U.S.C. 154(b) by 105 days.

(21) Appl. No.: 11/756,187

(22) Filed: May 31, 2007

(65) Prior Publication Data

US 2008/0301609 A1 Dec. 4, 2008

(51) Int. Cl.
*G06F 17/50* (2006.01)
(52) U.S. Cl. .............................................. 716/8; 716/4
(58) Field of Classification Search ................ 716/8–12, 716/4
See application file for complete search history.

(56) References Cited

U.S. PATENT DOCUMENTS 6,658,633 B2* 12/2003 Devins et al. ................... 716/5
7,096,446 B2* 8/2006 Karniewicz ..................... 716/9

OTHER PUBLICATIONS

Kumar et al., "A Test Structure Adviosr and a Coupled, Library-Based Test Structure Layout and Testing Environment" IEEE Transactions on Semiconductor Manufacturing vol. 10, No. 3, Aug. 1997, pp. 370-383.*
Kumar, M. V. et al.; "A Test Structure Advisor and a Coupled, Library-Based Test Structure Layout and Testing Environment"; IEEE Transactions on Semiconductor Manufacturing; Aug. 1997; pp. 370-383; vol. 10, No. 3; IEEE.

* cited by examiner

*Primary Examiner*—Jack Chiang
*Assistant Examiner*—Binh C Tat
(74) *Attorney, Agent, or Firm*—Michael J. Balconi-Lamica (57) ABSTRACT

A method of generating and placing of test structures in test chips comprises creating a control data set for one or more device types, generating a test structure layout in response to the control data set, and placing the test structure layout within a given pad array layout of the at least one pad array as a function of a set of keywords. The control data set includes (i) a set of keywords and (ii) parameter geometries for corresponding ones of test structures associated with the set of keywords. The keywords each define at least (a) one or more pad allocations for each test structure of a given device type, (b) a number quantity of test structures for the given device type, and (c) placement information of the test structures relative to one or more pad allocations of at least one pad array. The pad array layout is configured for enabling a fabrication of corresponding test structures in test chips.

17 Claims, 11 Drawing Sheets

| SUB-TYPE | DEVICE-TYPE | CELL NAME | LENGTH | WIDTH | ORIENTATION |
|---|---|---|---|---|---|
| ⋮ | ⋮ | ⋮ | ⋮ | ⋮ | ⋮ |
| NMOS | MOS3 | NMOS_N1 | 0.28 | 0.7 | R180 |
| NMOS | MOS3 | NMOS_N2 | 0.28 | 10.36 | R90 |
| NMOS | MOS3 | NMOS_N3 | 1.12 | 3.01 | ... |
| ⋮ | ⋮ | ⋮ | ⋮ | ⋮ | ⋮ |

*FIG. 10*

|  | 212 | 214 | 216 | 218 |
|---|---|---|---|---|
|  | DEVICE-TYPE | PADS PER DEVICE | TOTAL NO. DEVICES PER ARRAY | ARRAY TYPE |
|  | ⋮ | ⋮ | ⋮ | ⋮ |
| 220 — | MOS | 4 | 7 | 2 X 15 |
|  | MOS_C | 4 | 7 | 2 X 15 |
|  | MOS3 | 3 | 10 | 2 X 15 |
| 222 — | MOS3_C | 3 | 9 | 2 X 15 |
|  | MOS5 | 5 | 10 | 2 X 15 |
|  | MOS5_C | 5 | 9 | 2 X 15 |
|  | ⋮ | ⋮ | ⋮ | ⋮ |
|  | MOSN | 4 | 7 | 2 X 15 |
| 224 — | MOSN_C | 4 | 6 | 2 X 15 |
|  | ⋮ | ⋮ | ⋮ | ⋮ |
|  | SGPC | 1 | 11 | 1 X 12 |
| 226 — | SGPC_S | 1 | 10 | 1 X 12 |
|  | SGPC2 | 2 | 6 | 1 X 12 |
|  | SGPC2_S | 2 | 5 | 1 X 12 |
|  | SGPC3 | 3 | 4 | 1 X 12 |
|  | SGPC3_S | 3 | 3 | 1 X 12 |

210

KEY: "N" – NOISE PATTERN.
"_C" – PADS 1 AND 30 OF 2X15 LEFT OPEN FOR COMMON ROUTING.
"_S" – PAD 1 LEFT OPEN.

*FIG. 11*

| MISMATCH DEVICE-TYPE | DESCRIPTION |
|---|---|
| ⋮ | ⋮ |
| MSPL | 2 DEVICES, 3 PADS PER PAIR ON LEFT INSIDE OF 2x15. |
| MSPR | 2 DEVICES, 3 PADS PER PAIR ON RIGHT OUTSIDE OF 2x15. |
| MSPD | 2 DEVICES, PLACED ON LEFT INSIDE AND RIGHT OUTSIDE. |
| MSPLR90 | SAME AS MSPL, EXCEPT $2^{nd}$ DEVICE IS ROTATED 90 DEGREES. |
| MSPLR180 | SAME AS MSPL, EXCEPT $2^{nd}$ DEVICE IS ROTATED 180 DEGREES. |
| MSPRR90 | SAME AS MSPR, EXCEPT $2^{nd}$ DEVICE IS ROTATED 90 DEGREES. |
| MSPRR180 | SAME AS MSPR, EXCEPT $2^{nd}$ DEVICE IS ROTATED 180 DEGREES. |
| ⋮ | ⋮ |
| RSPL | 2 DEVICES, 4 PADS PER PAIR ON LEFT INSIDE OF 2x15. |
| RSPR | 2 DEVICES, 4 PADS PER PAIR ON RIGHT OUTSIDE OF 2x15. |
| ⋮ | ⋮ |

METHOD FOR GENERATION, PLACEMENT, AND ROUTING OF TEST STRUCTURES IN TEST CHIPS

BACKGROUND

1. Field

This disclosure relates generally to semiconductor device testing, and more specifically, to a method for generation, placement, and routing of test structures or device layouts in test chips.

2. Related Art

Early technology development for a given semiconductor technology generally requires a test mask for device exploration and characterization. In particular, many variations of test structures are often required for analog and BiCMOS devices. For example, variations may include over five hundred (500) 2×15 pad array structures that can contain six to twelve (6-12) test structures or devices each. Since the test chips are expensive to produce, repeatability and accuracy of test structure generation, placement, and routing in the arrays are desired. However, no previously known solutions have been effective in addressing these needs. Prior known methods have often required a user to provide extensive information regarding the structure, placement and routing for every test structure of a test chip. Such methods are tedious for the user and furthermore do not leverage known patterns.

Figure 1:
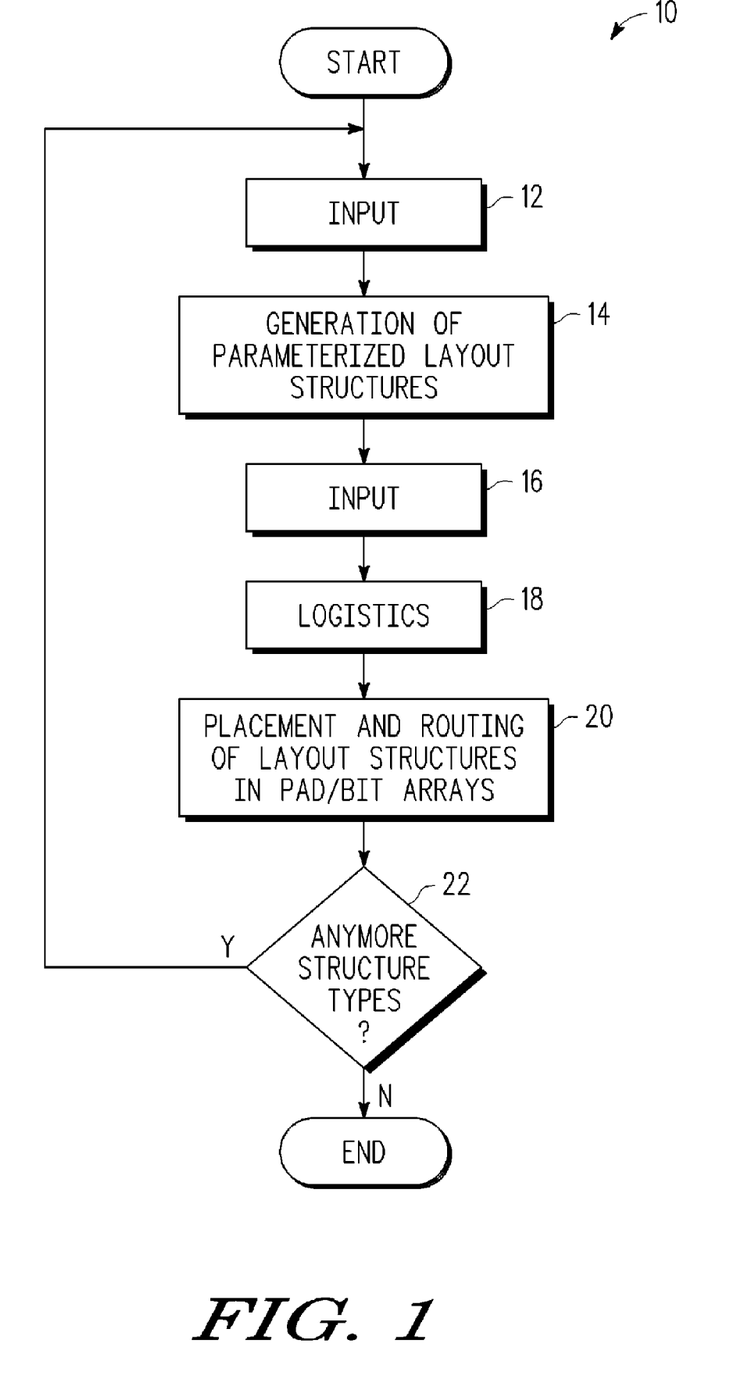
FIG. 1 is a flow diagram view of a prior known method of generating, placing and routing test structures within pad or bit arrays for test chips.

FIG. 1 is a flow diagram view 10 of a prior known method of generating, placing and routing of test structures for test chips. Upon an initiation of the method, at step 12, the tool set receives extensive information input. The information can be a combination of the following: cross-sections, parameterized cells and geometry values for the structure or design rule values that define the structure layout, schematics and geometry values for the corresponding structure. In response to receiving the input at step 12, the process continues at step 14 with a generation operation. The generation operation includes creating multiple test structure layout variations based on the geometry values.

In step 16, the method requires user specified information detailing the placement of the test structure within the pad array or test array. User specified information relates to (i) how terminals on the test structure need to be routed and (ii) where the test structure is placed within a pad or bit array structure. This procedure is quite cumbersome for a user and must be repeated for each test structure or test type of a given test chip. The method then proceeds to step 18.

In step 18, a user provides logistical information such as the physical location of the test structures being generated, any naming specifications and related details. This may be processed via a graphical user interface.

In step 20, responsive to data created by the generation operation and required user specified placement and routing information, the method generates test structures placed and routed within one or more pad or bit arrays. The generated test structure layouts typically require assembly within a fabricated test die and quality assurance verification. The test structures (or other input data) may be further utilized to drive testing equipment once the layouts are fabricated on wafers. Thereafter, the method ends.

The method described with respect to FIG. 1 suffers from various disadvantages. For example, the method does not address efficiency, wherein the user must specify generation, placement and routing information in a tedious manner. In addition, various steps in the method of FIG. 1 are not completely independent. For example, if generation information changes, such as device geometries or device layouts, then the placement and routing steps must be repeated. Still further, the method of FIG. 1 does not address repeatability in that if devices are similar in placement and routing requirements, then the user must still specify all information for each test structure for every technology. As a result, the methodology of FIG. 1 is inefficient, and thus making it difficult to maintain and use.

Accordingly, there is a need for an improved method for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

According to one embodiment of the present disclosure, a method of generating, placing and routing test structures within pad or bit arrays for test chips includes i) a predefined set of keywords that denotes pad allocation, generation options, and routing specifications and ii) keyword driven test structure placement and routing which can be independent. The method also includes test structure generation, placement, and routing in response to one or multiple inputs, wherein the generated test structures are created in an efficient and repeatable manner.

Figure 2:
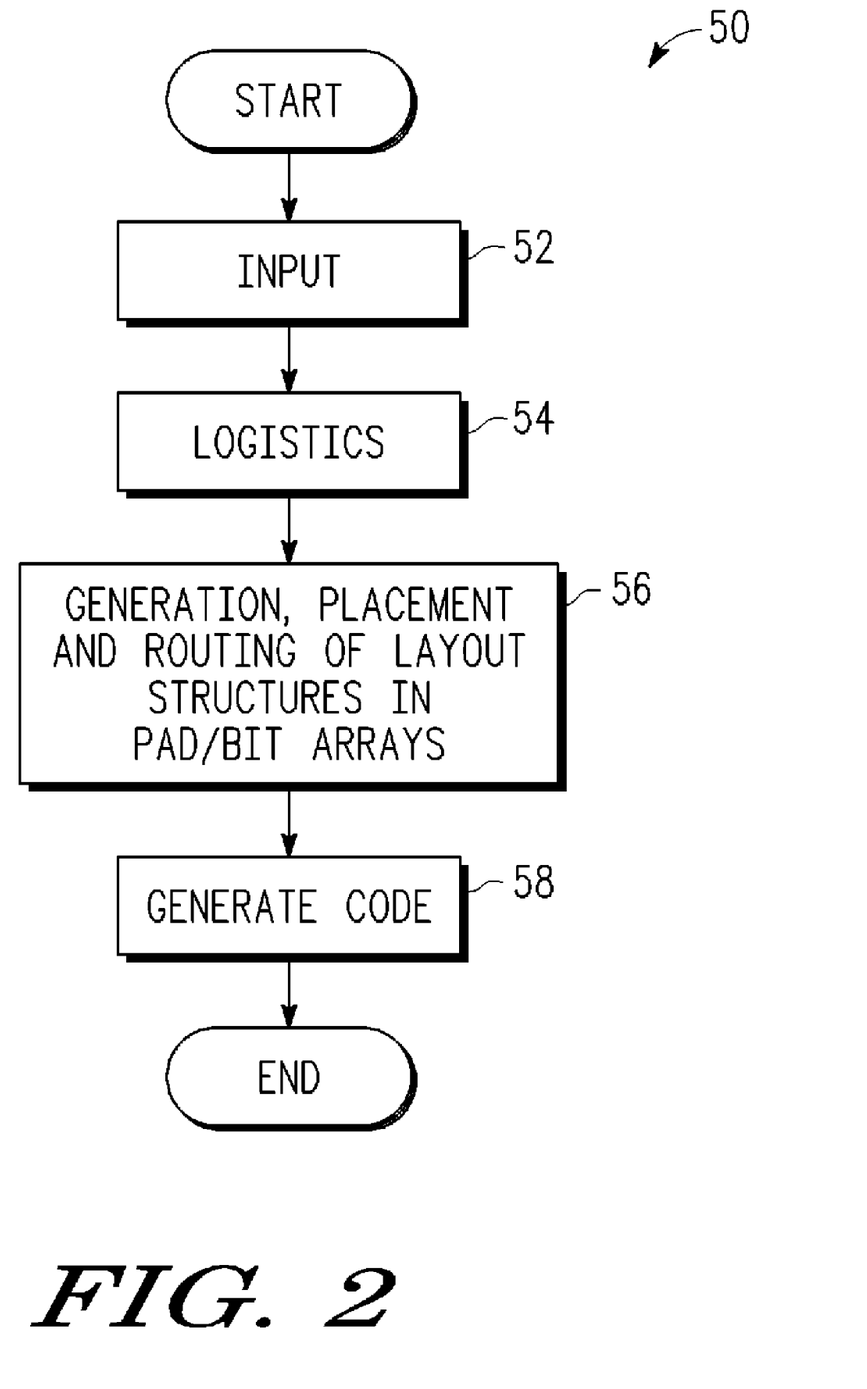
FIG. 2 is a flow diagram view of a method of generating, placing and routing test structures within pad or bit arrays for test chips according to one embodiment of the present disclosure.

FIG. 2 is a flow diagram view 50 of a method of generating, placing and routing test structures within pad or bit arrays for test chips according to one embodiment of the present disclosure. Upon an initiation of the method, at step 52, a system (or tool set) for implementing the method accepts and/or receives a text control file as an input. The control file contains predefined keywords, user specified geometries, and references to predefined parameterized cells and optionally associated schematics. The text control file is also referred to herein as a control data set.

In response to receiving the input at step 52, the process continues at step 54 with a logistics step. The logistics operation allows the user to further specify via a graphical user interface whether to optionally generate parameterized layout variations with or without the associated schematic view and to further specify (i) optional placement and (ii) optional routing or routing reuse. The method then continues with the generation, placement and routing within a pad array in step 56. Step 56 produces an ordered data set based on the input denoting hierarchical names, keywords, layout orientation and parameterized layout geometries. In response to this data set, a classification is determined based on predefined keywords. The predefined keywords (i) indicate the generation, placement and routing specifications, and (ii) guide the creation of the test structure arrays as an output, as further discussed herein below. In step 58, the method includes generating code representative of the generated test structure arrays. Instructions for implementing the method of creating the generated test structures are stored on a computer readable media and executable by a computer, in any suitable language according to the particular requirements of a given test chip application. Upon completion of the generation, placement and routing, the process can end, or alternatively, be restarted at any one of various points therein according to the requirements of a given system user.

Figure 3:
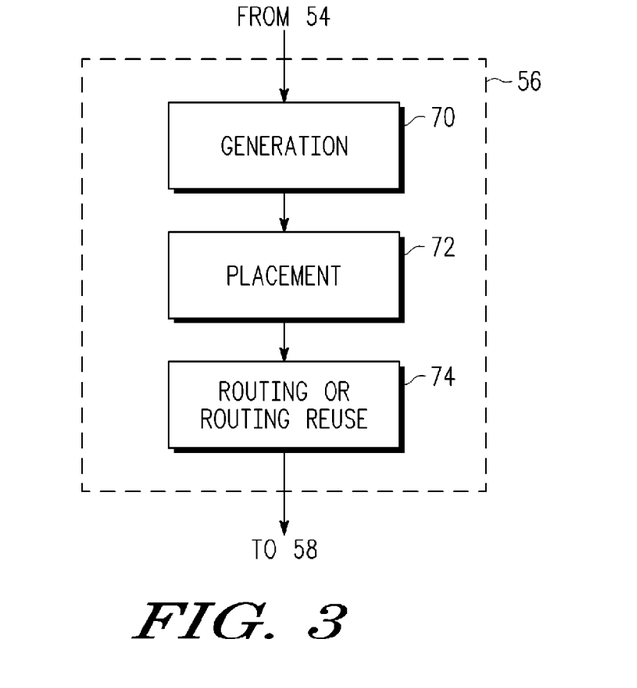
FIG. 3 is a flow diagram view of the generation, placement and routing portion of the method of generating placing and routing test structures within pad or bit arrays for test chips according to one embodiment of the present disclosure.

FIG. 3 is a flow diagram view of the generation, placement and routing portion 56 of the method of generating, placing, and routing test structures within pad or bit arrays for test chips according to one embodiment of the present disclosure. As discussed above, the generation, placement and routing portion 56 is responsive to a keyword driven data set for producing test structures optionally placed and routed within pad or bit arrays as an output. Recall that the keyword driven data set is generated from the inputs in step 52. Step 56 includes parameterized cell/layout generation step 70, determination and execution of parameterized structures within pad arrays step 72, and the routing of the generated structures within the pad arrays via predefined definitions step 74. Step 74 also includes reusing previously routed pad arrays as templates.

With respect to generation of parameterized structure/layouts step 70, elements of this portion of the method include processing of test structure geometry values, wherein the test structure geometry values are varied for suitable statistical data collection. For example, in one embodiment, the geometric values comprise geometric values of existing parameterized cells. As a result, the method advantageously provides a degree of efficiency. The handling of the test structure layout orientation, such as rotating 180 degrees or 90 degrees, can account for process variations that differ based on test structure placement. In addition, the method includes establishing predefined keywords to indicate structure generation specifications related to the type of electrical tests to be performed with a given test structure and/or test chip. For example, a predefined keyword "MOS6" can be used to indicate a MOSFET with six (6) terminals for undergoing DC tests. Whereas, another keyword "MOSK" can be used to indicate a power MOSFET with six (6) terminals; however, it will undergo Kelvin testing which results in a change in the routing scheme from that of the MOS6 structure. In some cases, two or more of the same layout structure and/or schematic is generated to test mismatch variations due to normal wafer variations. The above illustrates an example of one type of classification system that can be used for driving the elemental steps 70-74 of step 56. During the generation process, the generated structures are placed separately from the pad array to allow for hierarchical placement within the pad array, thereby allowing for regeneration without necessarily redoing placement and routing. The names given to the generated test structure variations can be user defined in the input or optionally determined via the tool set or system according to the embodiments of the present disclosure.

Step 72 includes placement of parameterized test structure/layouts, wherein step 72 also makes use of the predefined keywords. It is noted that the predefined keywords provide information for all aspects of step 56. Similar to step 70, the tool set or system in step 72 reviews one or more keyword obtained or found in the data set generated in step 52. The predefined keywords are expandable in that they are also used to indicate a test structure's pad allocation. For example, the keyword "MOS4" can indicate a test structure that requires four (4) pads of the given pad array and that the structure has a placement that is centered within the corresponding pads. As in step 70, the predefined, expandable keywords comprise definitions that advantageously convey information to the tool set in an efficient and repeatable manner. Accordingly, the keywords provide a certain type of usefulness and uniqueness. In other words, the keyword definitions drive the placement aspects of step 56, wherein the keyword definitions are derived from recognizing patterns in the test structures pad arrays and the types of electrical tests performed on the pad arrays once processed in a test chip.

In another example, a test structure for noise measurements can advantageously allow for pads of a pad array to be reused for two such test structures within the pad array, rather than simply one. This information could be indicated with the keyword "RESN2", wherein the "RES" portion of the keyword indicates a resistor, the "N" portion of the keyword indicates a noise measurement which influences the type of pad array and pad routing, and the "2" portion of the keyword indicates the double placement. The tool set or system must also recognize the total number of pads available in the pad array type which varies. Pad array types can include, for example, 2×15, 1×12, bit array schemes, and other variations. In addition, the input data received in step 52 may include any number of test structures. Accordingly, the tool set or system is further configured for detecting whether a given pad array is full. If a pad array is determined to be full, then the tool set continues by placing further test structures within a new pad array, the new pad array being assigned a different name from that of the prior pad array.

Step 74 includes routing or routing reuse of parameterized structure/layouts, wherein step 74 also makes use of the predefined keywords. As mentioned above, it is noted that the predefined keywords provide information for all aspects of step 56. Step 74 also includes the processing of the predefined keywords in the data set generated from the input in step 52. Similar to step 72, the tool set or system examines the keyword, wherein the keyword includes an indication of routing information within the pad array layout structure. The type of routing information required includes a terminal count on the test structure and how that test structure is routed to the pads within the pad or bit array. For example, the keyword "MOS4" can indicate a test structure with four (4) terminals, typically source (S), gate (G), drain (D) and body (B) contact; whereas, a bipolar junction transistor "BJT" keyword would indicate emitter (E), collector (C), and base (B), which has three (3) terminals but requires four (4) pads, wherein the fourth pad is required for a substrate contact. The tool set or system is configured for routing the terminals of a test structure to the pads of the pad array, and is further configured for establishing electrically correct routes. Considerations by the tool set or system include (i) the types of metals to be used for the pad terminals, (ii) recognizing manufacturing related design rules, such as metal width limitations, and (iii) avoiding shorting metals from other routes. Importantly, the predefined routing advantageously allows for repeatable, predictable behavior. The design rules are less of a concern if the optional schematic view is generated, placed and routed. The purpose of the schematic view is to allow for further verification. Another feature of the tool set or system is that it is further configured for routing reuse. With routing reuse, the tool set still processes the data set received in step 52, but rather than using the predefined keywords to determine routing, the tool set accepts a previously routed pad array and replaces existing test structures with the ones defined as an input. Accordingly, the method according to the embodiments of the present disclosure importantly provides for an independence of step 70 from steps 72 and 74.

Upon completion of the generation, placement and routing of steps 70-74 of step 56, the test structure layouts within the one or more pad arrays are ready for verification and assembly into the test die chip. Due to the repeatable and predictable nature of this methodology, the test structure layout and pad array outputs can also be further processed to generate files that drive testing equipment and/or for test chip documentation. In one embodiment, test structure generation considerations include a programming language specific format and tool environment. For example, the generated code can comprise instructions for using the test structure pad or bit arrays stored on a computer readable media and executable by a computer for layout and/or schematic related data processing. In addition, the various functions of the embodiments of the present disclosure, as discussed herein and illustrated via the flow diagrams, can be programmed using suitable programming techniques known in the art.

Figure 4:
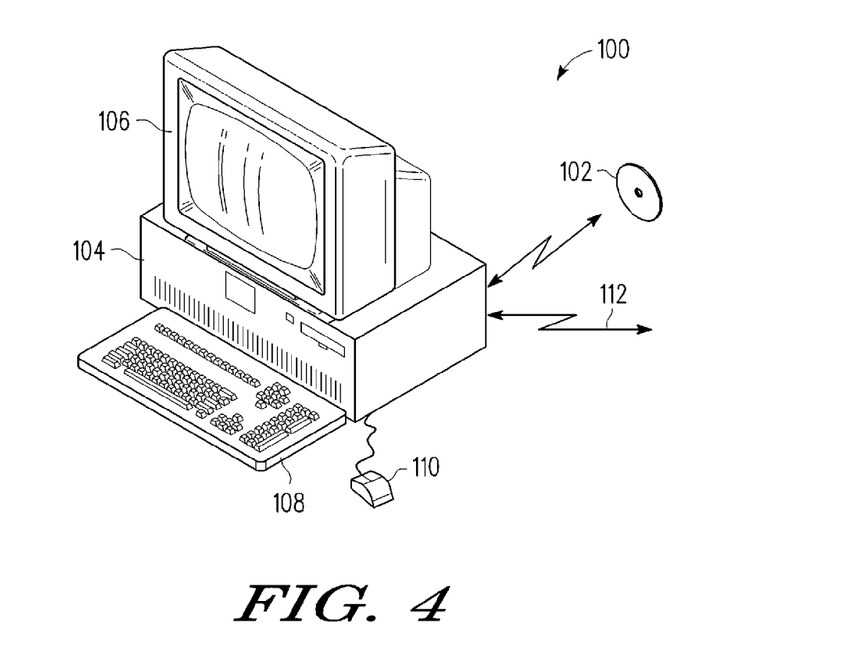
FIG. 4 is a block diagram view of a system for implementing the method for generating, placing, and routing test chips according to another embodiment of the present disclosure.

FIG. 4 is a block diagram view of a tool set or system 100 for implementing the method for generating, placing, and routing of test structures in pad arrays for test chips according to another embodiment of the present disclosure. System 100 includes a computer readable media 102, a computer 104, display 106, input/output device 108 (such as a keyboard, or the like), and pointer device 110 (such as a mouse, or the like). System 100 can comprise any suitable information handling system configured for carrying out the method of generating, placing, and routing test structures in test chips as discussed herein.

Computer readable media 102 includes computer readable instructions for being processed by computer 104 for generating, placing, and routing test structures in pad arrays for test chips according to the embodiments of the present disclosure. Graphical user interfaces (GUIs) are utilized in connection with display 106, as may be appropriate, throughout the process of generating, placing, and routing test structures in test chips for the obtaining of desired user inputs. User inputs can be obtained via input/output device 108 and/or pointer device 110. In addition to computer readable media 102, more than one computer readable media may be used, for example, computer readable media 112. In one embodiment, computer readable media 112 can include a network connection, such as, an internet, intranet, or other suitable connection.

Figure 5:
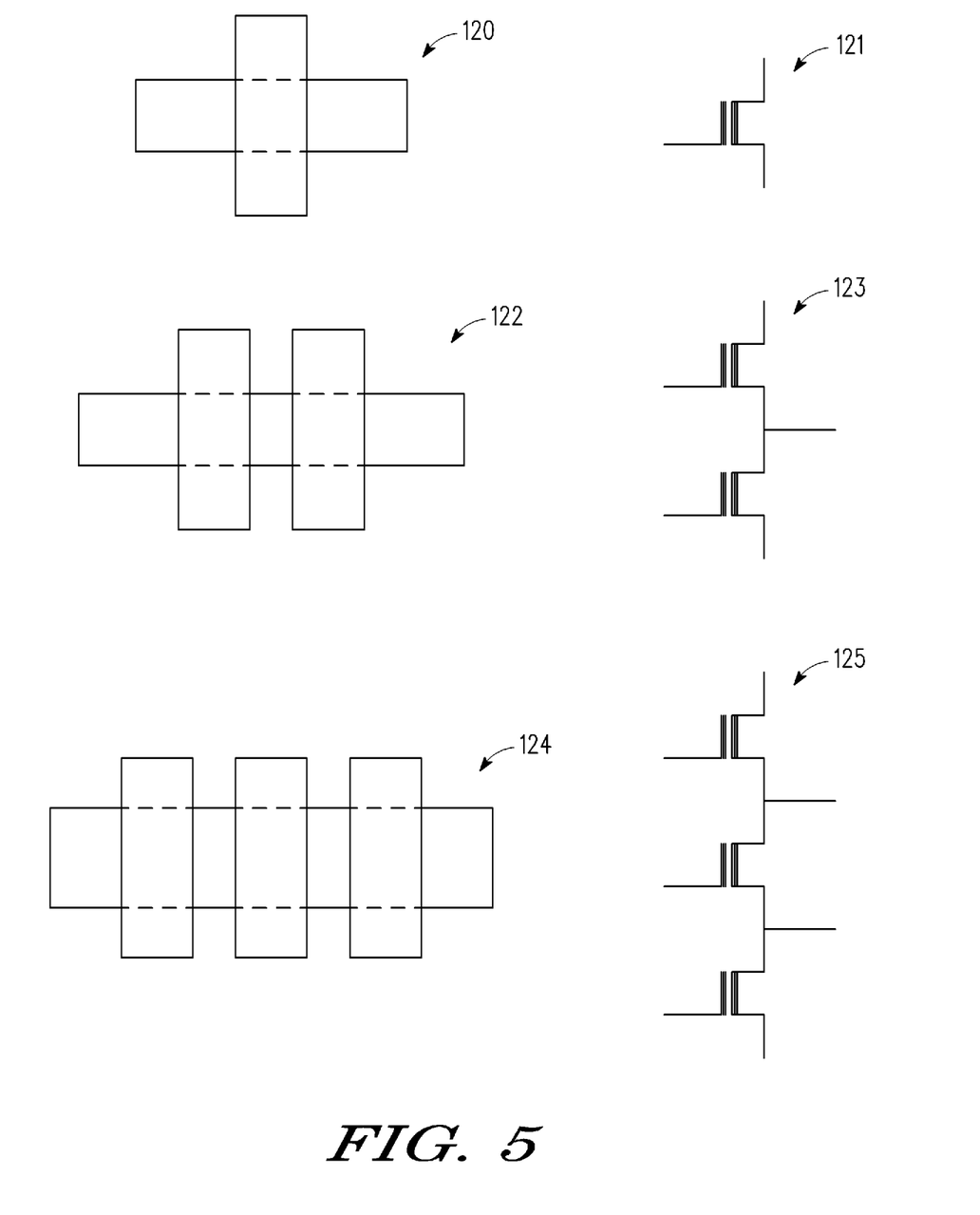
FIG. 5 is a structure layout view of several examples of test structures and their corresponding schematic views.

FIG. 5 is a structure layout view of several examples of test structures and their corresponding schematic views. For example, test structure layout 120 is representative of a MOSFET and schematic layout 121 corresponds to the schematic representation thereof. Test structure layout 122 is representative of a dual MOSFET structure and schematic layout 123 corresponds to the schematic representation thereof. Test structure layout 124 is representative of a triple MOSFET structure and schematic layout 125 corresponds to the schematic representation thereof.

Figure 6:
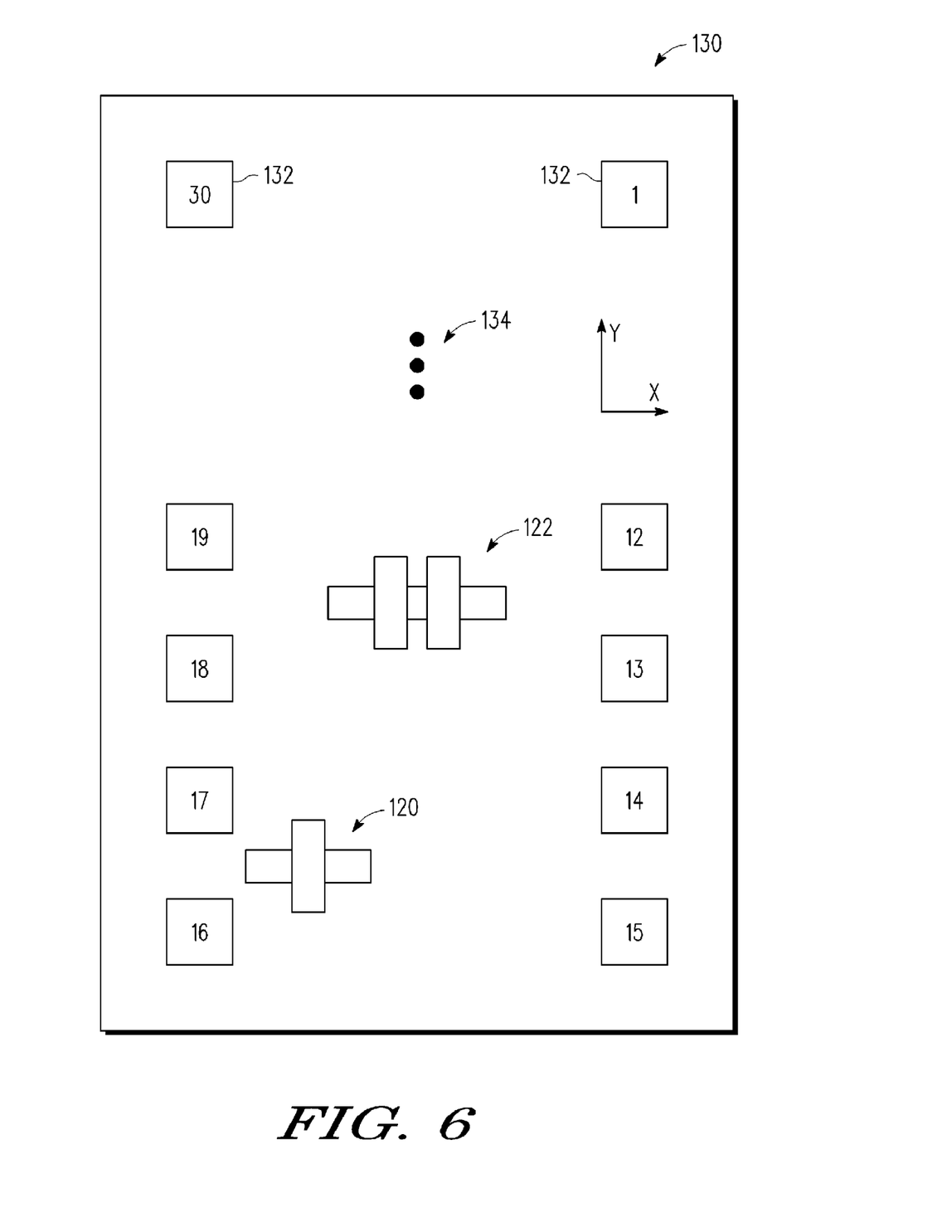
FIG. 6 is a diagrammatic view of an example of a (2×15) pad array layout including examples of test structure layouts disposed within the pad array layout.

FIG. 6 is a diagrammatic view of a example of a (2×15) pad array layout 130 including examples of test structure layouts (120,122) disposed within the pad array layout. In particular, pad array layout 130 includes a plurality of pads 132 (individually numbered in the range of 1-30), wherein pads not shown are otherwise illustrated by ". . . " and indicated by reference numeral 134. In FIG. 6, test structure layout 120 is illustrated as being placed proximate pads 16 and 17 on the left-hand side of pad array layout 130. In addition, test structure layout 122 is illustrated as being placed proximate a center portion of pad array layout 130 between pads 18 and 19 on the left-hand side of pad array layout 130 and pads 12 and 13 on the right-hand side of pad array layout 130. Further illustrated are x and y coordinate axes, wherein a placement of a test structure layout may be varied in one or both the x- and y- directions, according to the given test structure and pad array layout implementation requirements.

Figure 7:
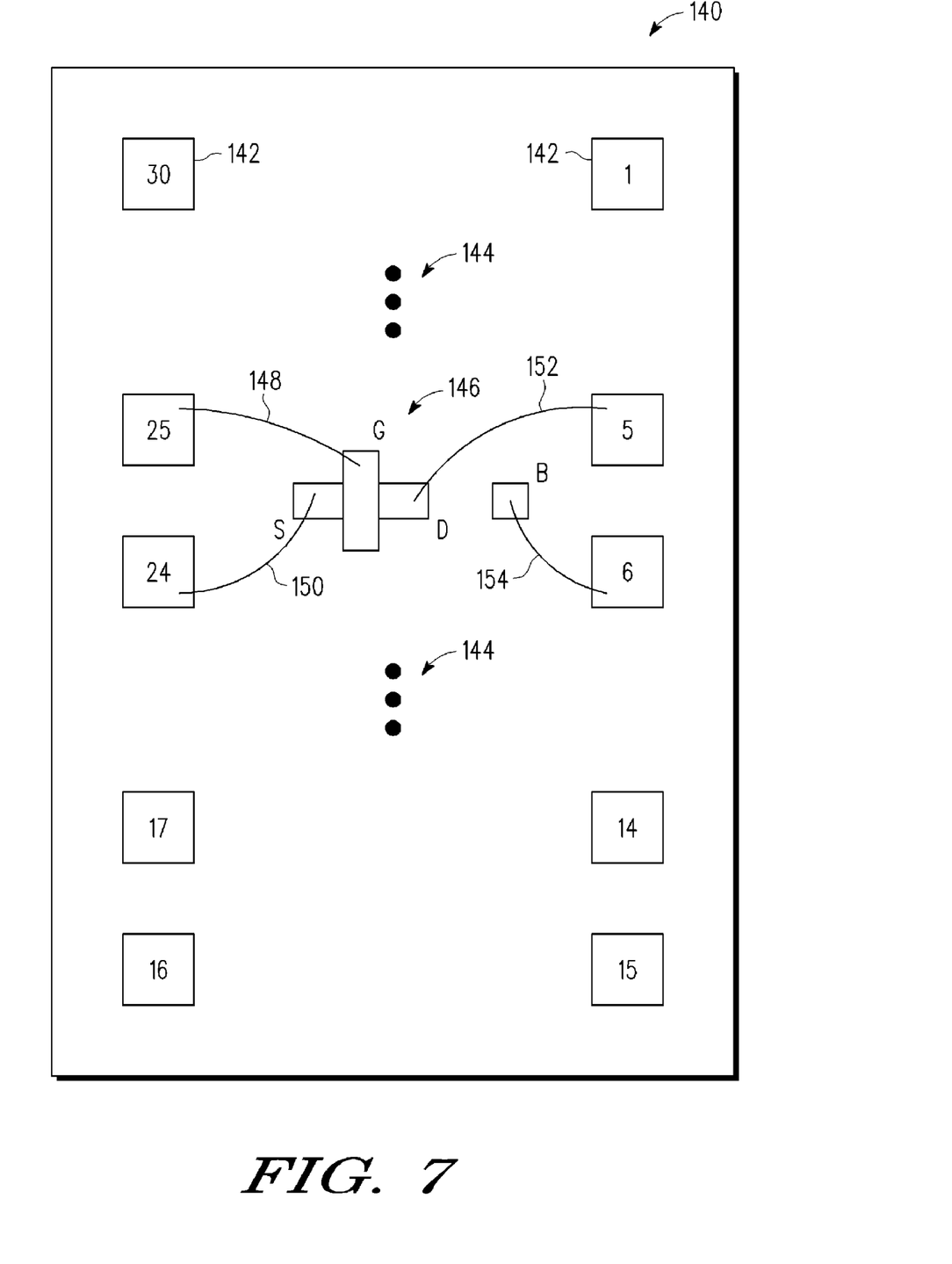
FIG. 7 is a diagrammatic view of an example of a (2×15) pad array layout including an example of a test structure layout disposed within the pad array layout and including routing between portions of the test structure and pads of the pad array.

FIG. 7 is a diagrammatic view of an example of a (2×15) pad array layout 140 including an example of a test structure layout 146 disposed within the pad array layout and including routing (150-154) between portions of the test structure and pads 142 of the pad array. In particular, pad array layout 140 includes a plurality of pads 142 (individually numbered in the range of 1-30), wherein pads not shown are otherwise illustrated by ". . . " and indicated by reference numeral 144. In FIG. 7, test structure layout 146 is illustrated as having routing 148 extending between a portion G of test structure 146 and pad 25 on the left-hand side of pad array layout 130. Routing 150 extends between a portion S of test structure 146 and pad 24 on the left-hand side of pad array layout 130. Routing 152 extends between a portion D of test structure 146 and pad 5 on the right-hand side of pad array layout 130. In this illustration, test structure 146 further includes a body contact B and routing 154 extends between body contact B and pad 6 on the right-hand side of pad array layout 130.

Figure 8:
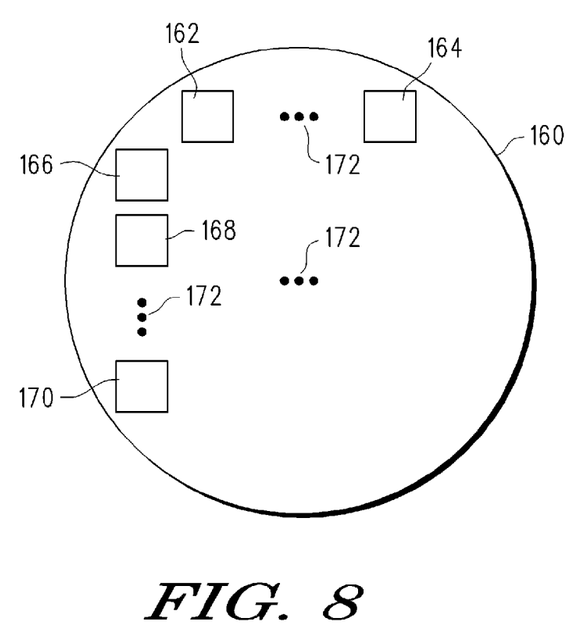
FIG. 8 is a diagrammatic view of a test wafer including a plurality of test chips formed by a method according to the embodiments of the present disclosure.
Figure 9:
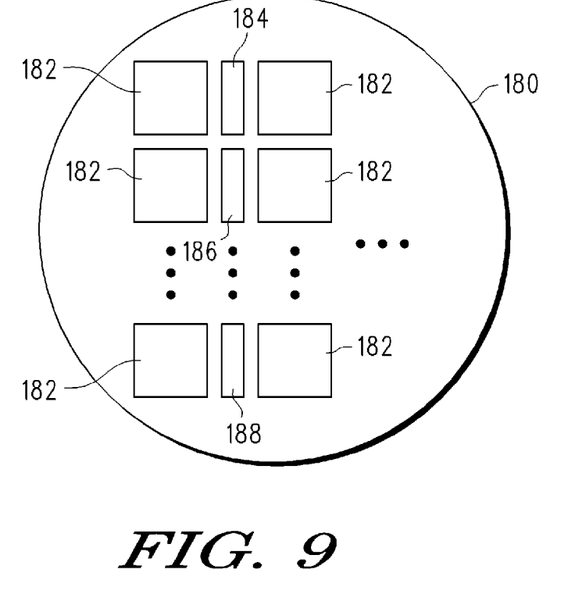
FIG. 9 is a diagrammatic view of a wafer including a plurality of test chips located within a scribe grid formed by a method according to the embodiments of the present disclosure.

FIG. 8 is a diagrammatic view of a test wafer 160 including a plurality of test chips 162, 164, 166, 168, and 170 (including test chips not shown but illustrated by ". . . " and indicated by reference numeral 172) formed by a method according to the embodiments of the present disclosure. FIG. 9 is a diagrammatic view of a wafer 180 including a plurality of test chips located within a scribe grid formed by a method according to the embodiments of the present disclosure. In particular, wafer 180 includes a plurality of integrated circuit chips 182 which are separated from one another by scribe streets which form a scribe grid. Test chips are located within the scribe streets of the scribe grid, for example, several of which are indicated by reference numerals 184, 186, and 188. Integrated circuits and test chips not shown are illustrated by ". . . ".

Figure 10:
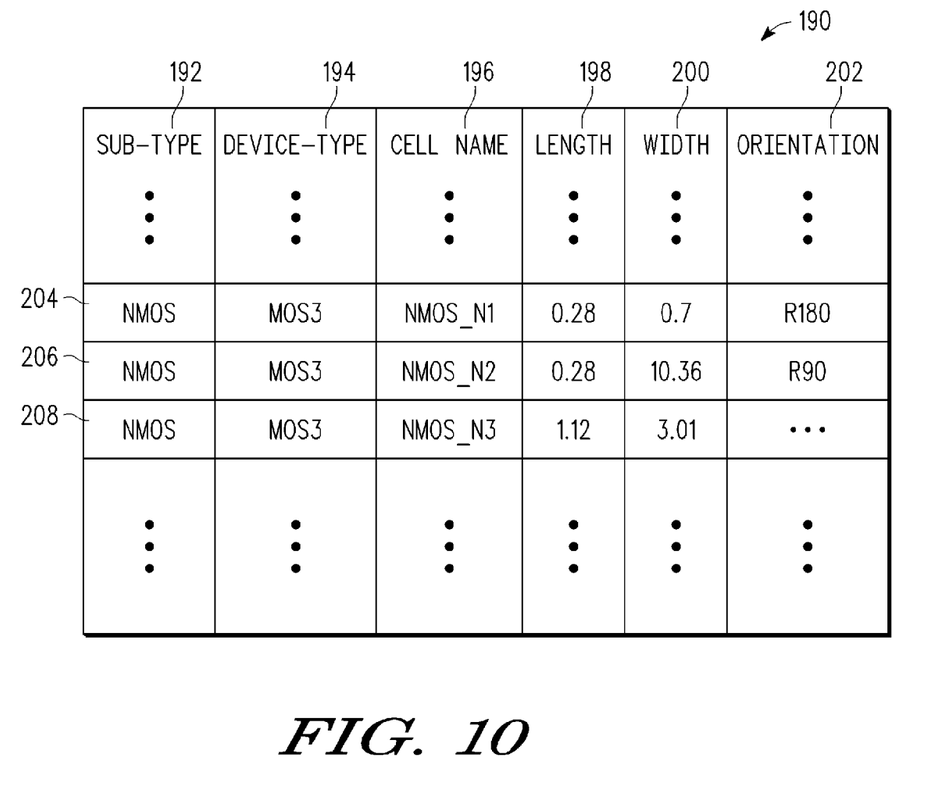
FIG. 10 is a table view of a portion of an example control data set file used in the method according to the embodiments of the present disclosure.

FIG. 10 is a table view of a portion of an example control data set file 190 used in the method according to the embodiments of the present disclosure. The control data set file 190 includes a number of columns, indicative of sub-type, device-type, cell name, length, width, orientation, and may include further columns, as may be needed for a given implementation. Column 192 provides various test structure sub-types, one of which is NMOS, for example. Column 194 provides various test structure device-types, one of which is MOS3, for example. Column 196 provides various parameterized cell names, several of which include NMOS_N1, NMOS_N2, and NMOS_N3, for example. Columns 198 and 200 provide various length and width dimensions, respectively. In addition, column 202 provides various test structure orientations, for example R180, R90, and "- - -" (the later being indicative of no rotation). In one embodiment, the data set file 190 is a tab delimited text file, wherein the contents of each column of each row are separated from one another via a "tab". Furthermore, keywords and parameters contained within rows 204, 206, and 208 correspond to three different test structure layouts.

Figure 11:
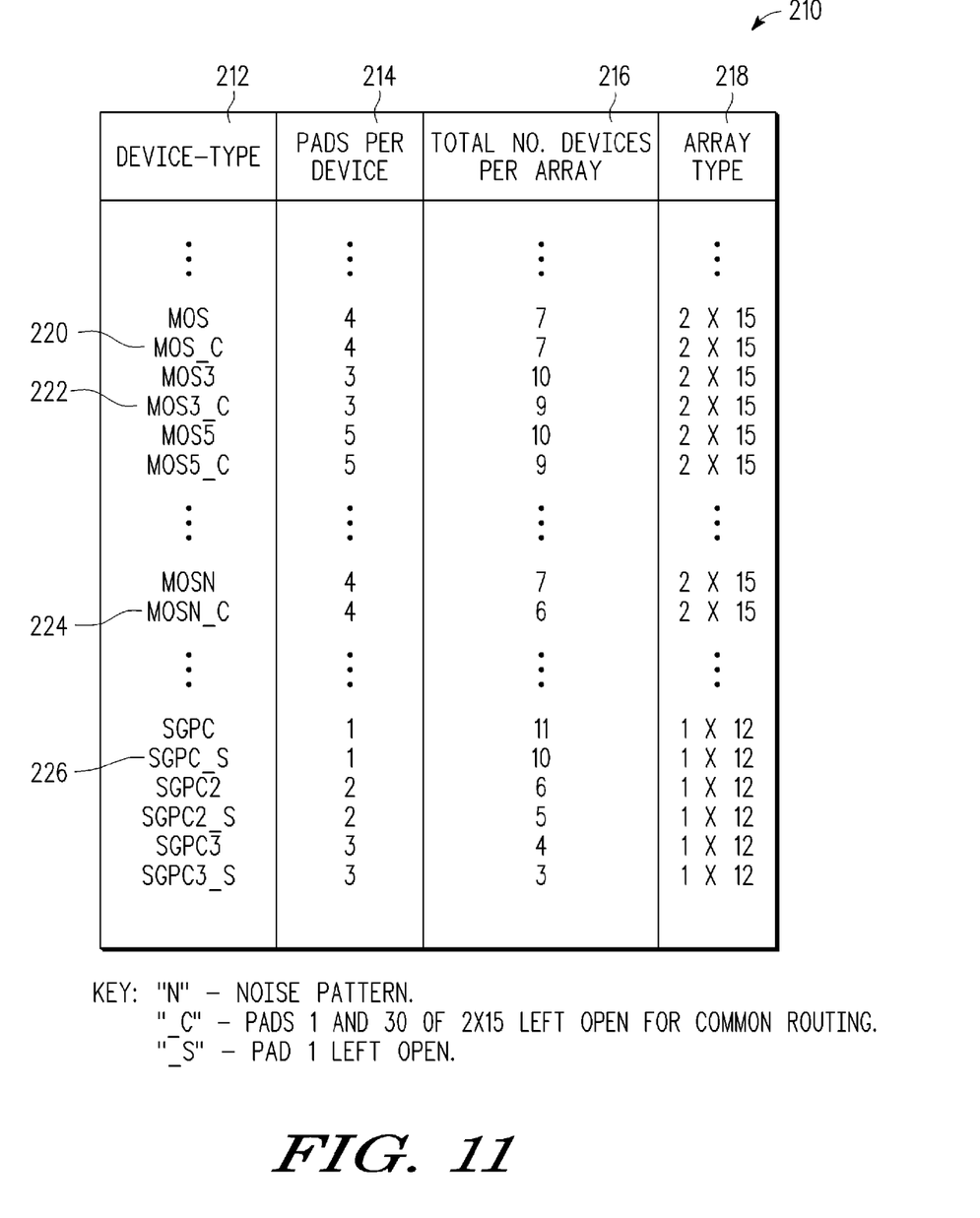
FIG. 11 is a table view of example device type options used in the method according to the embodiments of the present disclosure.

FIG. 11 is a table view 210 of example device type options used in the method according to the embodiments of the present disclosure. The table 210 includes a number of columns, indicative of device-type 212, number of pads per test structure device 214, total number of test structure devices per array 216, and array type 218. The device types include predefined keywords. For example, in row 220, the keyword "MOS_C" is representative of a quantity of four (4) pads per test structure device, seven (7) total number of test structure devices per array, and to be implemented within a 2×15 pad array. In row 222, the keyword "MOS3_C" is representative of a quantity of three (3) pads per test structure device, nine (9) total number of test structure devices per array, and to be implemented within a 2×15 pad array. In row 224, the keyword "MOSN_C" is representative of a quantity of four (4) pads per test structure device, six (6) total number of test structure devices per array, and to be implemented within a 2×15 pad array. In row 226, the keyword "SGPC_S" is representative of a quantity of one (1) pad per test structure device, ten (10) total number of test structure devices per array, and to be implemented within a 1×12 pad array. Furthermore, the designations "N" conveys a noise pattern, "_C" conveys that pads 1 and 30 of a 2×15 pad are left open for common routing, and "_S" conveys that pad 1 is left open. Other rows are illustrated, wherein some content has been simply indicated by ". . .".

Figure 12:
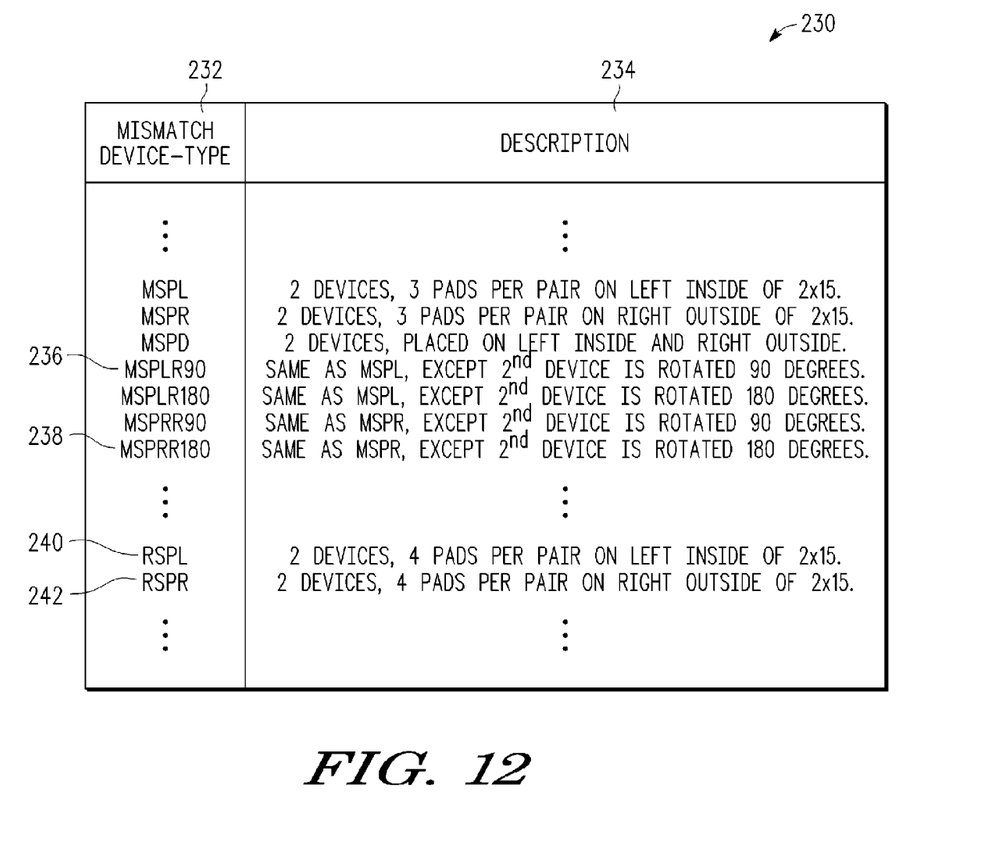
FIG. 12 is a table view of example mismatch device type option descriptions used in the method according to the embodiments of the present disclosure.

FIG. 12 is a table view 230 of example mismatch device type option descriptions used in the method according to the embodiments of the present disclosure. The table 230 includes columns indicative of mismatch device-type 232 and corresponding descriptions 234. The mismatch device types include predefined keywords. For example, in row 236, the keyword "MSPLR90" is representative of "MOSFET Simple Pair Left" corresponding to a quantity of two test structure devices, three (3) pads per pair on the left inside of a 2×15 pad array, wherein the second device of the pair is rotated by 90 degrees (as indicated by "R90"). In row 238, the keyword "MSPRR180" is representative of "MOSFET Simple Pair Right" corresponding to a quantity of two test structure devices, three (3) pads per pair on the right outside of a 2×15 pad array, wherein the second device of the pair is rotated by 180 degrees (as indicated by "R180"). In row 240, the keyword "RSPL" is representative of "Resistor Simple Pair Left" corresponding to a quantity of two test structure devices, four (4) pads per pair on the left inside of a 2×15 pad array. In row 242, the keyword "RSPR" is representative of "Resistor Simple Pair Right" corresponding to a quantity of two test structure devices, four (4) pads per pair on the right outside of a 2×15 pad array. Other rows are illustrated, wherein some content has been simply indicated by ". . .".

Figure 13:
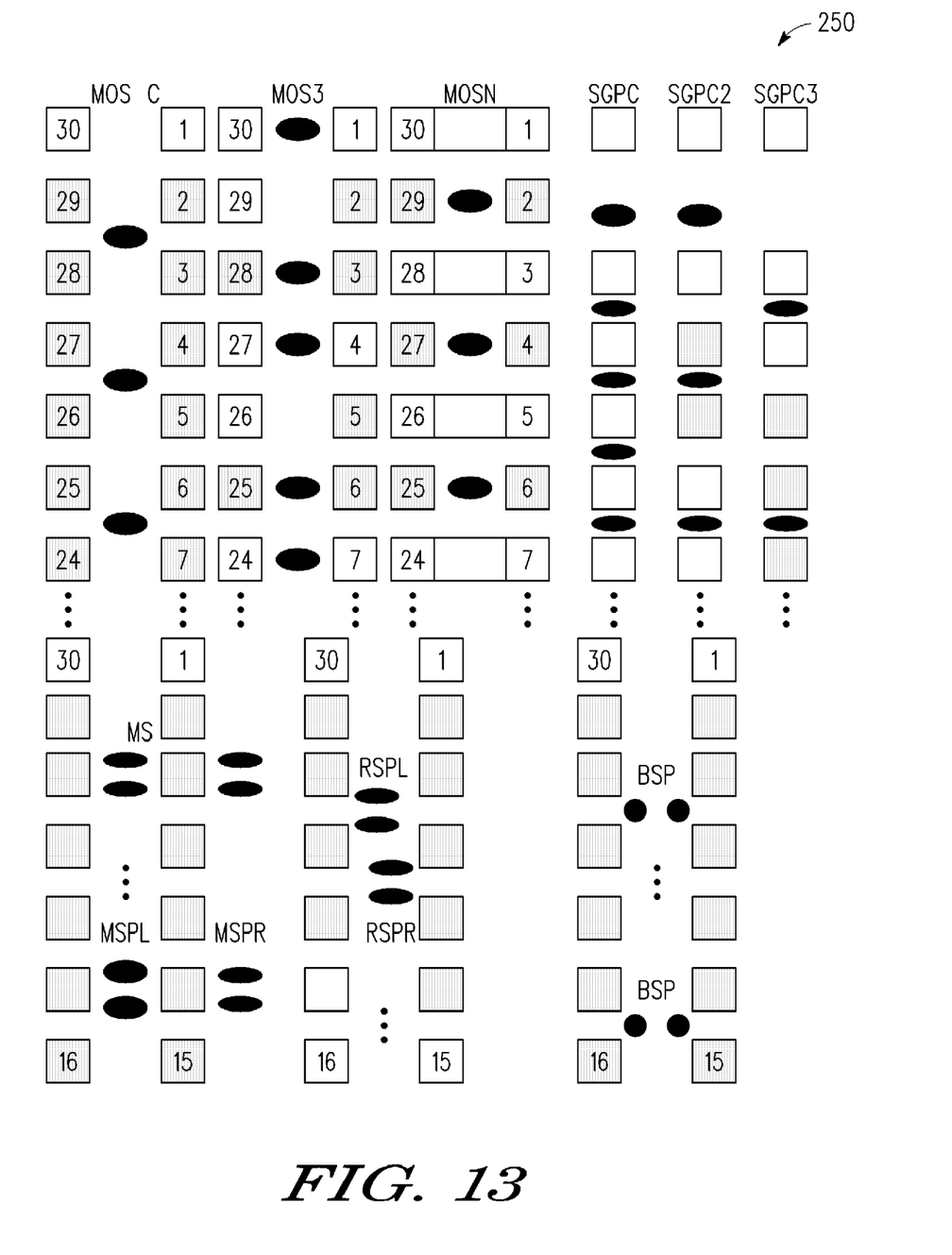
FIG. 13 is a plan view of several examples of test structure layout placement within a pad array using the method according to the embodiments of the present disclosure.

FIG. 13 is a plan view 250 of several examples of test structure layout placement within a pad array using the method according to the embodiments of the present disclosure.

By now it should be appreciated that there has been provided a method of generating and placing of test structures in test chips comprises creating a control data set for one or more device types, generating a test structure layout in response to the control data set, and placing the test structure layout within a given pad array layout of the at least one pad array as a function of the set of keywords. The control data set includes (i) a set of keywords and (ii) parameter geometries for corresponding ones of test structures associated with the set of keywords. The keywords each define (a) one or more pad allocations for each test structure of a given device type, (b) a number quantity of test structures for the given device type, and (c) placement information of the test structures relative to one or more pad allocations of at least one pad array. In addition, the pad array layout is configured for enabling a fabrication of corresponding test structures in test chips. In addition, the control data set can further include (iii) test structure naming information, and (iv) test structure orientation information.

The method further comprises establishing, for one or more device types of a given semiconductor technology, a predefined set of keywords in which each keyword defines (i) the one or more pad allocations for each test structure of a given device type, (ii) the number quantity of test structures for the given device type, and (iii) the placement information of the test structures relative to one or more pad allocations of the at least one pad array. In addition, creating the control data set for one or more device types further includes (a) providing an input file comprising (i) user selected keywords and (ii) parameter geometries for corresponding ones of test structures to be associated with the user selected keywords; and (b) comparing the input file against the predefined set of keywords and parameter geometries of previously established parameterized cells and schematics. The set of predefined keywords may also comprise definitions stored on a computer readable medium, the predefined set of keywords further defining one or more classifications which are used in driving the generating and placing of test structures.

In another embodiment, the keywords each further define (d) test structure terminal routing requirements relative to allocated pads of the one or more pad allocations of the at least one pad array. In such an embodiment, placing the test structure layout within a given pad array layout of the at least one pad array as a function of the set of keywords further includes implementing a corresponding test structure terminal routing. In addition, the keywords each still further define (e) identification of a type of test that is to be performed with a corresponding test structure, wherein the type of test includes at least one corresponding generation, placement, and terminal routing requirement. Furthermore, the method includes classifying test structures into sub-classes, wherein a sub-class is associated with a given type of pad array to further facilitate placement and terminal routing requirements.

In yet another embodiment, generating the test structure layout further includes generating multiple structures based on keywords contained in the data set, wherein the multiple structures include simple pairs for use in characterizing process mismatch. Still further according to another embodiment, generating the test structure layout can also include generating schematic variations of corresponding test structure layouts, wherein placing the test structure layout within the given pad array layout further includes placing the schematic variations within the pad array layout proximate a corresponding test structure layout.

In another embodiment, placing the test structure layout within a given pad array layout of the at least one pad array as a function of the set of keywords further includes placement of the test structure layout within the pad array layout by a given spacing in x-coordinate and y-coordinate directions as a function of a corresponding keyword. In such an embodiment, the keywords each still further define (e) identification of a type of test that is to be performed with a corresponding test structure, wherein the type of test to be performed with the corresponding test structure includes one selected from the group consisting of (i) DC testing, wherein DC testing uses centered spacing of the test structure within the pad array, (ii) mismatch testing, wherein mismatch testing includes spacing the test structure proximate one set of pads of the pad array, and (iii) noise measurement testing, wherein noise measurement testing uses double row spacing of a same test structure within the pad array. In another embodiment, the at least one pad array comprises at least one selected from the group consisting of a 1×12 pad array, a 2×15 pad array, an SParam pad array, a noise pad array, and a bit array.

According to another embodiment, a method of generating and placing of test structures in test chips comprises establishing, for one or more device types of a given semiconductor technology, a predefined set of keywords in which each keyword defines (a) one or more pad allocations for each test structure of a given device type, (b) a number quantity of test structures for the given device type, (c) placement information of the test structures relative to one or more pad allocations of at least one pad array, (d) test structure terminal routing requirements relative to allocated pads of the one or more pad allocations of the at least one pad array, and (e) identification of a type of test that is to be performed with a corresponding test structure, wherein the type of test includes at least one corresponding generation, placement, and terminal routing requirement. The method further includes creating a control data set for the one or more device types, generating a test structure layout in response to the control data set, and placing the test structure layout within a given pad array layout of the at least one pad array as a function of the set of keywords and implementing a corresponding test structure terminal routing. The control data set includes (i) a set of keywords and (ii) parameter geometries for corresponding ones of test structures associated with the set of keywords. In addition, the pad array layout is configured for enabling a fabrication of corresponding test structures in test chips.

In another embodiment, creating the control data set for one or more device types further includes: (a) providing an input file comprising (i) user selected keywords and (ii) parameter geometries for corresponding ones of test structures to be associated with the user selected keywords; and (b) comparing the input file against the predefined set of keywords and parameter geometries of previously established parameterized cells and schematics. In addition, the set of predefined keywords can comprise definitions stored on a computer readable medium, the predefined set of keywords further defining one or more classifications which are used in driving the generating and placing of test structures. Furthermore, generating the test structure layout can further include generating multiple structures based on keywords contained in the data set, wherein the multiple structures include simple pairs for use in characterizing process mismatch. In another embodiment, generating the test structure layout further includes generating schematic variations of corresponding test structure layouts, and wherein placing the test structure layout within the given pad array layout further includes placing the schematic variations within the pad array layout proximate a corresponding test structure layout.

In another embodiment, a computer program product comprises instructions stored on a computer readable media and executable by a computer, the instructions for carrying out the method of generating, placing, and routing of test structures in test chips according methods disclosed herein.

Although the invention is described herein with reference to specific embodiments, various modifications and changes can be made without departing from the scope of the present invention as set forth in the claims below. For example, one embodiment of the present disclosure can include the handling of non-standard or unrecognized shapes. The embodiments of the present disclosure can further include the handling of the repeating of an entire structured layout or a portion of the entire structured layout. The embodiments of the present disclosure still further can comprise the use of one or more variables in place of calculated dimension values. The embodiments of the present disclosure can also provide benefits for semiconductor process development in which an extensive number of device variations are generally needed to test and model new semiconductor processes.

For example, one benefit can include a shortened cycle time in one or more phases of new technology development and design starts. Accordingly, the embodiments of the present disclosure address keyword driven parameterization, generation, placement and routing of test structures within pad arrays, expandable to bit arrays for processing of test chips which may be stored in, and used from, any library of an electronic design automation software program. In addition, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

What is claimed is:

1. A method of generating and placing of test structures in test chips comprising:
  creating a control data set for one or more device types, wherein the control data set includes (i) a set of keywords and (ii) parameter geometries for corresponding ones of test structures associated with the set of keywords, and wherein the keywords each define (a) one or more pad allocations for each test structure of a given device type, (b) a number quantity of test structures for the given device type, and (c) placement information of the test structures relative to one or more pad allocations of at least one pad array;
  generating a test structure layout in response to the control data set;
  placing the test structure layout within a given pad array layout of the at least one pad array as a function of the set of keywords, wherein the pad array layout is configured for enabling a fabrication of corresponding test structures in test chips; and establishing, for one or more device types of a given semiconductor technology, a predefined set of keywords in which each keyword defines (i) the one or more pad allocations for each test structure of a given device type, (ii) the number quantity of test structures for the given device type, and (iii) the placement information of the test structures relative to one or more pad allocations of the at least one pad array, and wherein the set of predefined keywords comprise definitions stored on a computer readable medium, the predefined set of keywords further defining one or more classifications which are used in driving the generating and placing of test structures.

2. The method of claim 1, wherein creating the control data set for one or more device types further includes:

(a) providing an input file comprising (i) user selected keywords and (ii) parameter geometries for corresponding ones of test structures to be associated with the user selected keywords; and (b) comparing the input file against the predefined set of keywords and parameter geometries of previously established parameterized cells and schematics.

3. The method of claim 1, wherein the keywords each further define (d) test structure terminal routing requirements relative to allocated pads of the one or more pad allocations of the at least one pad array.

4. The method of claim 3, wherein placing the test structure layout within a given pad array layout of the at least one pad array as a function of the set of keywords further includes implementing a corresponding test structure terminal routing.

5. The method of claim 3, wherein the keywords each still further define (e) identification of a type of test that is to be performed with a corresponding test structure, wherein the type of test includes at least one corresponding generation, placement, and terminal routing requirement.

6. The method of claim 3, further comprising:

classifying test structures into sub-classes, wherein a sub-class is associated with a given type of pad array to further facilitate placement and terminal routing requirements.

7. The method of claim 1, wherein generating the test structure layout further includes generating multiple structures based on keywords contained in the data set, wherein the multiple structures include simple pairs for use in characterizing process mismatch.

8. The method of claim 1, wherein generating the test structure layout further includes generating schematic variations of corresponding test structure layouts, and wherein placing the test structure layout within the given pad array layout further includes placing the schematic variations within the pad array layout proximate a corresponding test structure layout.

9. The method of claim 1, wherein placing the test structure layout within a given pad array layout of the at least one pad array as a function of the set of keywords further includes placement of the test structure layout within the pad array layout by a given spacing in x-coordinate and y-coordinate directions as a function of a corresponding keyword.

10. The method of claim 9, wherein the keywords each still further define (e) identification of a type of test that is to be performed with a corresponding test structure, wherein the type of test to be performed with the corresponding test structure includes one selected from the group consisting of (i) DC testing, wherein DC testing uses centered spacing of the test structure within the pad array, (ii) mismatch testing, wherein mismatch testing includes spacing the test structure proximate one set of pads of the pad array, and (iii) noise measurement testing, wherein noise measurement testing uses double row spacing of a same test structure within the pad array.

11. The method of claim 1, wherein the at least one pad array comprises at least one selected from the group consisting of a 1×12 pad array, a 2×15 pad array, an SParam pad array, a noise pad array, and a bit array.

12. The method of claim 1, wherein the control data set further includes (iii) test structure naming information, and (iv) test structure orientation information.

13. A method of generating and placing of test structures in test chips comprising:

establishing, for one or more device types of a given semiconductor technology, a predefined set of keywords in which each keyword defines (a) one or more pad allocations for each test structure of a given device type, (b) a number quantity of test structures for the given device type, (c) placement information of the test structures relative to one or more pad allocations of at least one pad array, (d) test structure terminal routing requirements relative to allocated pads of the one or more pad allocations of the at least one pad array, and (e) identification of a type of test that is to be performed with a corresponding test structure, wherein the type of test includes at least one corresponding generation, placement, and terminal routing requirement, wherein the set of predefined keywords comprise definitions stored on a computer readable medium, the predefined set of keywords further defining one or more classifications which are used in driving the generating and placing of test structures;

creating a control data set for the one or more device types, wherein the control data set includes (i) a set of keywords and (ii) parameter geometries for corresponding ones of test structures associated with the set of keywords;

generating a test structure layout in response to the control data set; and placing the test structure layout within a given pad array layout of the at least one pad array as a function of the set of keywords and implementing a corresponding test structure terminal routing, wherein the pad array layout is configured for enabling a fabrication of corresponding test structures in test chips.

14. The method of claim 13, wherein creating the control data set for one or more device types further includes:

(a) providing an input file comprising (i) user selected keywords and (ii) parameter geometries for corresponding ones of test structures to be associated with the user selected keywords; and (b) comparing the input file against the predefined set of keywords and parameter geometries of previously established parameterized cells and schematics.

15. The method of claim 13, wherein generating the test structure layout further includes generating multiple structures based on keywords contained in the data set, wherein the multiple structures include simple pairs for use in characterizing process mismatch.

16. The method of claim 13, wherein generating the test structure layout further includes generating schematic variations of corresponding test structure layouts, and wherein placing the test structure layout within the given pad array layout further includes placing the schematic variations within the pad array layout proximate a corresponding test structure layout.

17. A computer program product comprising instructions stored on a computer readable media and executable by a computer, the instructions for carrying out a method of generating and placing of test structures in test chips comprising:

creating a control data set for one or more device types, wherein the control data set includes (i) a set of keywords and (ii) parameter geometries for corresponding ones of test structures associated with the set of keywords, and wherein the keywords each define (a) one or more pad allocations for each test structure of a given device type, (b) a number quantity of test structures for the given device type, and (c) placement information of the test structures relative to one or more pad allocations of at least one pad array;

generating a test structure layout in response to the control data set;

placing the test structure layout within a given pad array layout of the at least one pad array as a function of the set of keywords, wherein the pad array layout is configured for enabling a fabrication of corresponding test structures in test chips; and establishing, for one or more device types of a given semiconductor technology, a predefined set of keywords in which each keyword defines (i) the one or more pad allocations for each test structure of a given device type, (ii) the number quantity of test structures for the given device type, and (iii) the placement information of the test structures relative to one or more pad allocations of the at least one pad array, and wherein the set of predefined keywords comprise definitions stored on a computer readable medium, the predefined set of keywords further defining one or more classifications which are used in driving the generating and placing of test structures.

* * * * *